United States Patent
Zechmann

(10) Patent No.: US 9,425,090 B2
(45) Date of Patent: Aug. 23, 2016

(54) METHOD OF ELECTRODEPOSITING GOLD ON A COPPER SEED LAYER TO FORM A GOLD METALLIZATION STRUCTURE

(71) Applicant: Infineon Technologies Austria AG, Villach (AT)

(72) Inventor: Arno Zechmann, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/491,470

(22) Filed: Sep. 19, 2014

(65) Prior Publication Data

US 2016/0086847 A1 Mar. 24, 2016

(51) Int. Cl.
*H01L 21/44* (2006.01)
*H01L 21/768* (2006.01)
*H01L 23/528* (2006.01)
*H01L 23/532* (2006.01)

(52) U.S. Cl.
CPC ... *H01L 21/76873* (2013.01); *H01L 21/76865* (2013.01); *H01L 21/76879* (2013.01); *H01L 23/528* (2013.01); *H01L 23/53238* (2013.01); *H01L 23/53242* (2013.01); *H01L 23/53266* (2013.01)

(58) Field of Classification Search
None
See application file for complete search history.

(56) References Cited

U.S. PATENT DOCUMENTS

| | | | | | |
|---|---|---|---|---|---|
| 4,628,149 | A | * | 12/1986 | Dohya | H01L 23/49866 174/257 |
| 5,084,894 | A | * | 1/1992 | Yamamoto | B82Y 20/00 372/26 |
| 6,037,602 | A | * | 3/2000 | Polce | H01L 25/167 250/551 |
| 2010/0133688 | A1 | * | 6/2010 | Shigihara | H01L 24/05 257/738 |
| 2013/0207206 | A1 | * | 8/2013 | Van Steenwinckel | G01N 27/3275 257/414 |

* cited by examiner

*Primary Examiner* — Mohammad Islam
*Assistant Examiner* — Jay C Chang
(74) *Attorney, Agent, or Firm* — Murphy, Bilak & Homiller, PLLC

(57) ABSTRACT

An electrically conductive barrier layer is formed on a semiconductor substrate such that the barrier layer covers a first device terminal. A seed layer is formed on the barrier layer. The seed includes a noble metal other than gold. The substrate is masked so that a first mask opening is laterally aligned with the first terminal. An unmasked portion of the seed layer is electroplated using a gold electrolyte solution so as to form a first gold metallization structure in the first mask opening. The mask, the masked portions of the seed layer, and the barrier layer are removed. The noble metal from the unmasked portion of the seed layer is diffused into the first gold metallization structure. The first gold metallization structure is electrically connected to the first terminal via the barrier layer.

14 Claims, 9 Drawing Sheets

METHOD OF ELECTRODEPOSITING GOLD ON A COPPER SEED LAYER TO FORM A GOLD METALLIZATION STRUCTURE

TECHNICAL FIELD

The present invention generally relates to semiconductor devices and more particularly relates to techniques for forming gold metallization layers that may be connected to one or more semiconductor devices.

BACKGROUND

Metallization layers are commonality utilized in semiconductor applications for electrically connecting one or more semiconductor devices, such as MOSFETs, IGBTs, diodes, etc. For example, a metallization layer may be used in an integrated circuit to electrically connect power and ground potential to individual transistor devices. Further, metallization layers may be used in an integrated circuit as interconnects for the input and output terminals of the transistors. A variety of processing techniques are available for forming semiconductor metallization layers such as electroplating, chemical or physical vapor deposition, etc. Lithography techniques are commonly utilized to provide metallization lines with precisely controlled width and pitch.

In many cases, copper is a preferred material for semiconductor metallization layers. Copper offers low electrical resistance and is therefore conducive to high frequency switching operation of semiconductor devices. Further, copper is advantageous in high power applications because it provides low resistive losses and high thermal conductivity. However, copper metallization lines may be susceptible to reliability issues. Particularly in the case of high-temperature and high-humidity conditions, copper is prone to corrosion, oxidation, and/or electromigration. Unless proper mitigation steps are taken, the risk of electrical short in copper metallization lines (e.g., between a source and drain line) due to copper dendrites and/or cathodic-anodic filamentation (CAF) may be unacceptably high.

Known techniques for mitigating the risk of electrical short in copper metallization lines include forming protective layers that seal the copper and prevent electromigration and/or diffusion of the copper. For example, protective layers formed from materials such as nickel (Ni), palladium (Pd) and gold (Au) may be used to protect and seal copper metallization layers. However, these techniques introduce undesirable expense and complexity to the process.

SUMMARY

According to an embodiment, a method of forming a metallization for electrically connecting one or more semiconductor devices is disclosed. According to the method, an electrically conductive barrier layer is formed on a semiconductor substrate such that the barrier layer covers a first terminal of a device formed in the substrate. A seed layer is formed on the barrier layer. The seed layer extends over the first terminal and includes a noble metal other than gold. The substrate is masked with a mask having a first opening that is laterally aligned with the first terminal such that an unmasked portion of the seed layer is exposed by the first opening and such that a masked portion of the seed layer is covered by the mask. The unmasked portion of the seed layer is electroplated using a gold electrolyte solution so as to form a first gold metallization structure arranged in the first mask opening. The mask is removed and the masked portions of the seed layer and the barrier layer are removed. The noble metal from the unmasked portion of the seed layer is diffused into the first gold metallization structure. The first gold metallization structure is electrically connected to the first terminal via the barrier layer.

According to an embodiment, a method of forming a gold metallization structure by electrodeposition using a copper seed layer is disclosed. According to the method, an electrically conductive barrier layer covering a surface of a semiconductor substrate is formed. The substrate includes a source and drain terminal of a semiconductor device. A continuous portion of the barrier layer contacts the source and drain terminals. A copper seed layer is formed such that a continuous seed layer portion covers the continuous portion of the barrier layer. The seed layer is masked with a mask having first and second openings that are laterally aligned with the source and drain terminals. Unmasked portions of the seed layer are electroplated using a gold electrolyte solution so as to form first and second gold metallization structures arranged in the first and second mask openings. The mask is removed. The masked portions of the seed layer and the barrier layer are removed so as to electrically isolate the first and second gold metallization structures. Copper atoms from the seed layer are diffused into the first and second gold metallization structures such that respective interfaces between the barrier layer and the first and second gold metallization structures are substantially devoid of metallic copper. The first and second gold metallization structures are electrically connected to the first and second terminals, respectively.

According to an embodiment, a semiconductor device is disclosed. The semiconductor device includes a substrate having first and second terminals of one or more semiconductor devices. First and second barrier metal regions are electrically connected to the first and second terminals, respectively. First and second gold metallization structures are electrically connected to the first and second terminals via the first and second barrier metal regions, respectively. The first and second gold metallization structures include diffused copper atoms. Interfaces between the first and second barrier metals and the first and second gold metallization structures, respectively, are substantially devoid of metallic copper.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments disclosed herein include a method of forming a gold metallization structure, such as a power line or interconnect line that is electrically connected to one or more semiconductor devices. The gold metallization structure is formed by an electroplating using a photolithography mask to define the geometry of the metallization lines. The seed layer is formed from a noble metal other than gold, such as copper. After the electroplating process, portions of the seed layer are removed, e.g., by etching. The remaining metallic portion of the seed layer underneath the gold metallization structure is diffused into the gold structure. As a result, the device is substantially devoid of the seed layer in its metallic state.

Advantageously, the embodiments disclosed herein provide an electroplated gold metallization line that is resistant to electromigration and/or diffusion, while using a seed layer material other than gold (e.g., copper) that is easily and reliably etched away. Although gold seed layers may be used to form an electroplated gold metallization line, a drawback of this technique is that the removal of the seed layer (e.g., by etching with aqua regia) often leads to redeposition of metallic gold. This presents a high risk of electrical short. An alternative to electroplating is an evaporation and resist-lift-off technique. However, minimum structure widths and distances required for modern semiconductor device metallizations (e.g., below 30 μm) may be difficult or impossible to achieve using resist-lift-off techniques.

By using copper as a seed layer, most of the copper material can be easily removed from the device, e.g., by wet-chemical etch techniques, with a low likelihood of redeposition. The remaining copper in the device can be diffused into the gold structures. As a result, the gold structures include diffused copper atoms, but there is little to no metallic state bulk copper that is at risk of corrosion, oxidation or electromigration. That is, the processes described herein utilize copper as a seed layer, but the copper is rendered inert by a diffusion step. Further, by using an electroplating process with a copper seed layer, the embodiments described herein can be easily and cost-effectively implemented into existing copper electroplating process technologies, e.g., by selecting the appropriate electrolyte solution.

Figure 1:
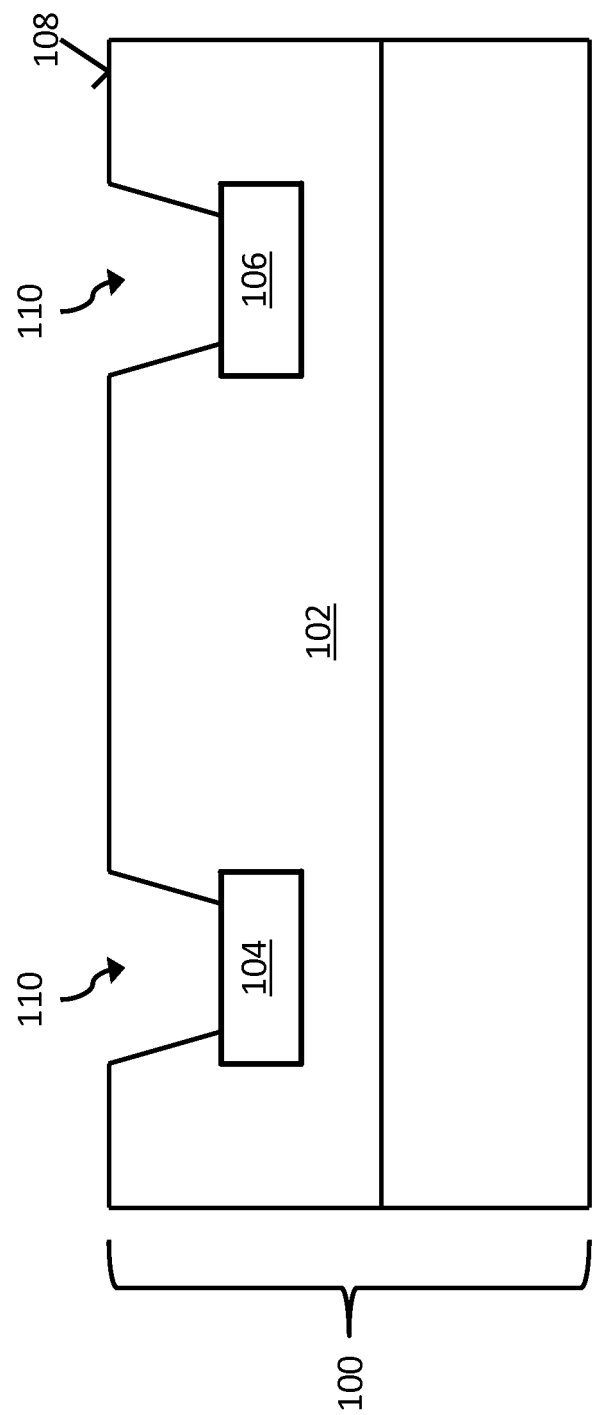
FIG. 1 depicts a semiconductor substrate with a device formed in the substrate and having first and second exposed terminals, according to an embodiment.

Referring to FIG. 1, a semiconductor substrate 100 is depicted. The semiconductor substrate 100 may be formed from any commonly known semiconductor material, such as silicon (Si), silicon carbide (SiC), germanium (Ge), a silicon germanium crystal (SiGe), gallium nitride (GaN), gallium arsenide (GaAs), and the like. The semiconductor substrate 100 may be a bulk substrate or alternatively may include one or more epitaxially grown layers 102.

One or more semiconductor devices are formed in the substrate 100. The semiconductor devices may be any device requiring electrical connection. Examples of such semiconductor devices MOSFETs, IGBTs, diodes, etc. Terminals of the semiconductor devices are exposed from the substrate. That is, the semiconductor substrate 100 of FIG. 1 is formed with at least one semiconductor device that is ready for electrical connection to a metallization layer. This may be done according to known techniques. The terminal may be an input terminal or output terminal of the device, such as a source region, a drain region, a gate electrode, an emitter region, a collector region, etc. The terminal may be a region of semiconductor material or an electrical conductor formed in the substrate.

According to an embodiment, the substrate 100 includes a power transistor (e.g., an IGBT) with first and second terminals 104, 106 that are source and drain regions of the power transistor. According to an embodiment, contract trenches 110 extend from the main surface 108 of the substrate 100 to first and second terminals 104, 106 so as to expose the first and second terminals 104, 106. The first and second terminals 104, 106 are laterally separated from one another. As used herein, a lateral direction refers to a direction that is parallel to a main surface 108 of the semiconductor substrate 100.

Figure 2:
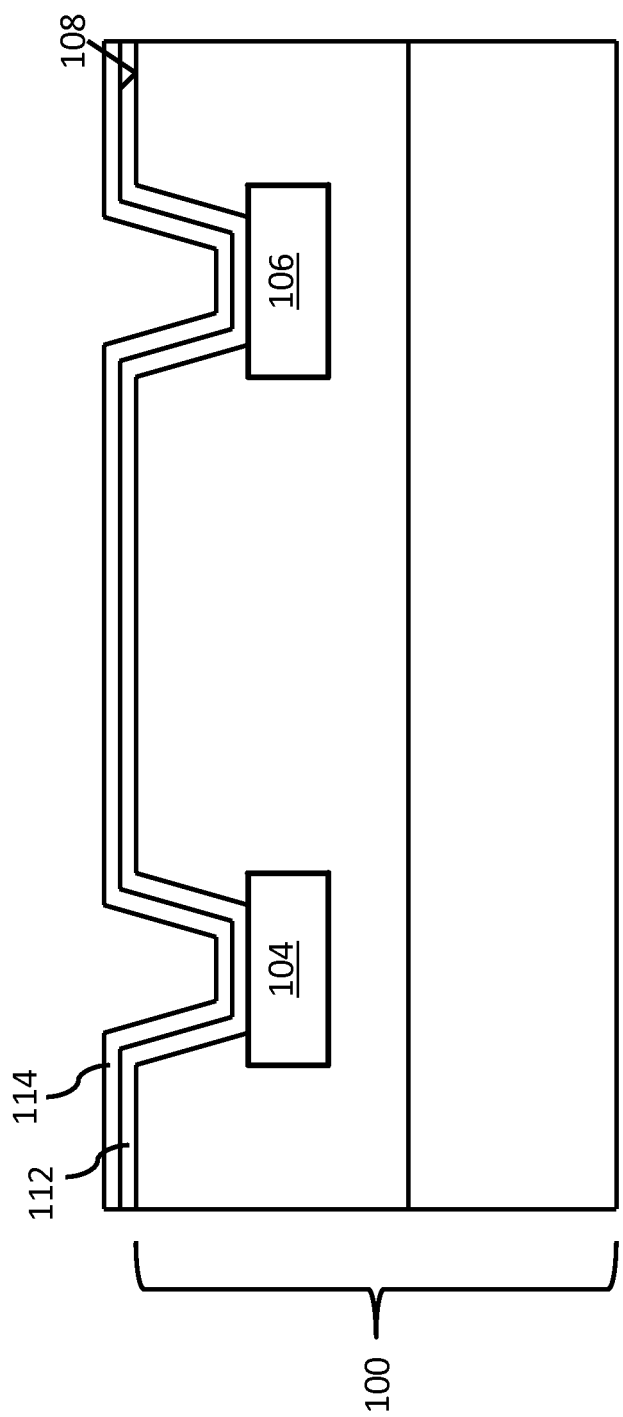
FIG. 2 depicts the formation of a barrier layer on the substrate and the formation of a seed layer on the barrier layer, according to an embodiment.

Referring to FIG. 2, a barrier layer 112 is formed on the substrate 100. The barrier layer 112 is formed from an electrically conductive material that is configured to prevent electromigration of an adjoining metal conductor (e.g., copper). For example, the barrier layer 112 may be formed from tantalum (Ta), tantalum-nitride (TaN), titanium (Ti), titanium-nitride (TiN), titanium-tungsten (TiW), and the like. According to an embodiment, the barrier layer 112 is between 0.01-1 μm thick. The barrier layer 112 may be formed by a deposition technique (e.g., sputtering, evaporation-or chemical vapor deposition), for example.

The barrier layer 112 is formed along the surface 108 of the substrate 100 and covers at least one of the first and second terminals 104, 106. As shown in FIG. 2, the barrier layer 112 covers both the first and second terminals 104, 106. According to an embodiment, a continuous barrier layer 112 portion contacts both the first and second terminals 104, 106 and extends along the surface 108 of the substrate 100 between the first and second terminals 104, 106. Alternatively, one or more intervening conductive layers (not shown) may be provided between the barrier layer 112 and the terminals 104, 106. Further, other barrier layers (not shown) may be formed on the substrate 100, either above or below the depicted barrier layer 112. The barrier layer 112 may be a complete layer that is formed along the entire surface of the substrate 100 or alternatively may cover only a portion of the substrate 100 that includes at least one of the terminals 104, 106.

Also referring to FIG. 2, a seed layer 114 is formed on the barrier layer 112. The seed layer 114 extends over at least one of the first and second terminals 104, 106, and may be coextensive with the barrier layer 112. That is, the seed layer 114 may have the same lateral boundaries as the barrier layer 112, and may completely cover the substrate 100. According to an embodiment, a continuous seed layer 114 portion covers the continuous barrier layer 112 portion. Thus, the continuous seed layer 114 portion is arranged over and extends between the first and second terminals 104, 106. Further, in embodiments that include the contact trenches 110, the continuous portions of the seed layer 114 and the barrier layer 112 may extend into these contact trenches.

The seed layer 114 may be formed from any electrical conductor that is suitable as cathode electrode for an electroplating process. Examples of such conductors include noble metals other than gold such as silver (Ag), platinum (Pt) or palladium (Pd) and copper (Cu). As used herein, the term noble metal refers to a metal that is resistant to chemical action, does not corrode, and is not easily dissolved by acid (e.g., acids associated with an electroplating process). According to an embodiment, the seed layer 114 is a layer of copper (Cu). The seed layer 114 may have a thickness of between 0.1-3 µm. The seed layer 114 may be formed by a deposition technique (e.g., sputtering, evaporation or chemical vapor deposition), for example.

Figure 3:
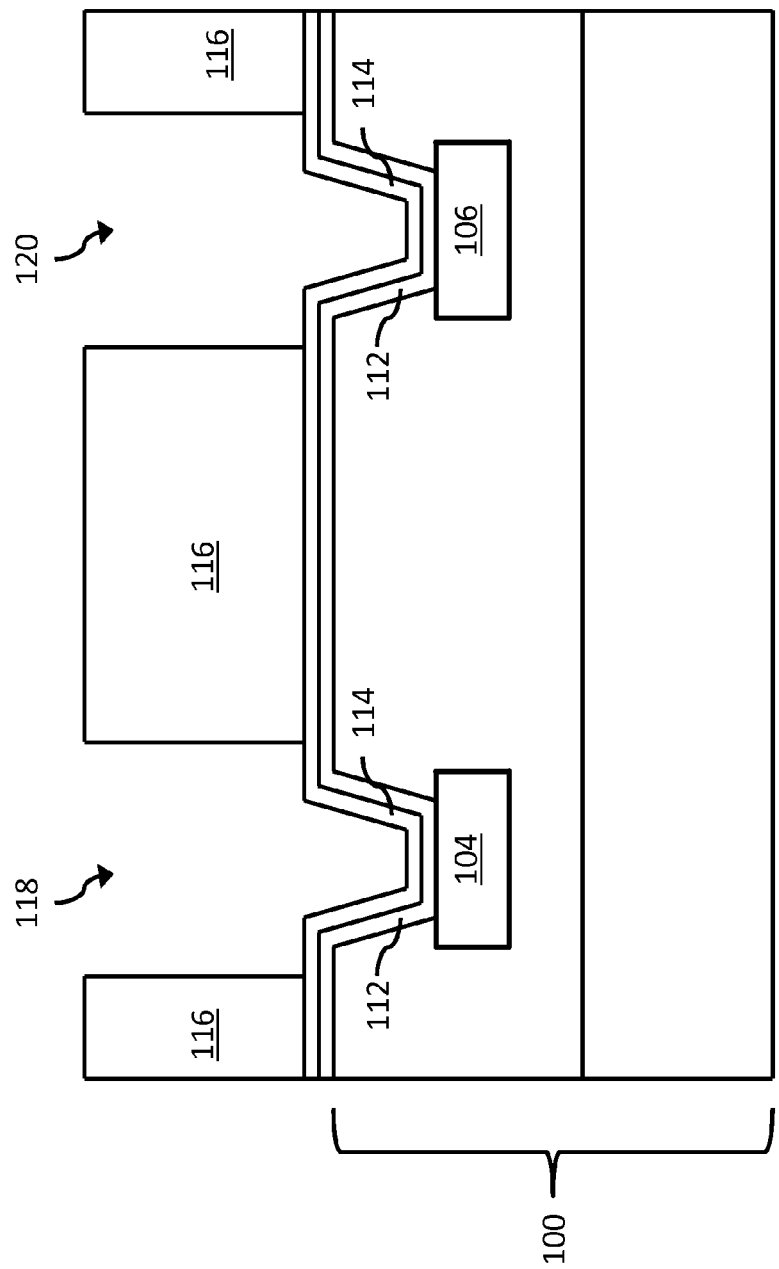
FIG. 3 depicts masking the substrate with a mask having first and second openings that are laterally aligned with the first and second terminals of the semiconductor device, according to an embodiment.

Referring to FIG. 3, the substrate 100 including the seed layer 114 and the barrier layer 112 is masked. According to an embodiment, a photoresist mask 116 having first and second openings 118, 120 is formed on the substrate 100. The photoresist mask 116 may be formed according to commonly known techniques. The first and second openings 118, 120 are laterally aligned with the first and second terminals 104, 106, respectively As shown in FIG. 3, the mask 116 is configured such that unmasked portions of the seed layer 114 and the barrier layer 112, which extend over the first and second terminals 104, 106, are exposed by the first and second openings 118, 120, respectively. Likewise, masked portions of the seed layer 114 are covered by the mask 116. In the event that the substrate 100 includes contact trenches 110, the unmasked portions of the seed layer 114 and barrier layer 112 are arranged in the contact trenches 110.

The mask 116 may be patterned in any desired geometry. For example, if the substrate 100 includes a plurality of devices, the mask 116 may be pattered with openings corresponding to the input and/or output terminals of each device. Furthermore, the minimum geometric features of the photoresist mask 116 (e.g., minimum widths and pitch) may be adjusted, depending upon the configuration of the devices and the application requirements.

Figure 4:
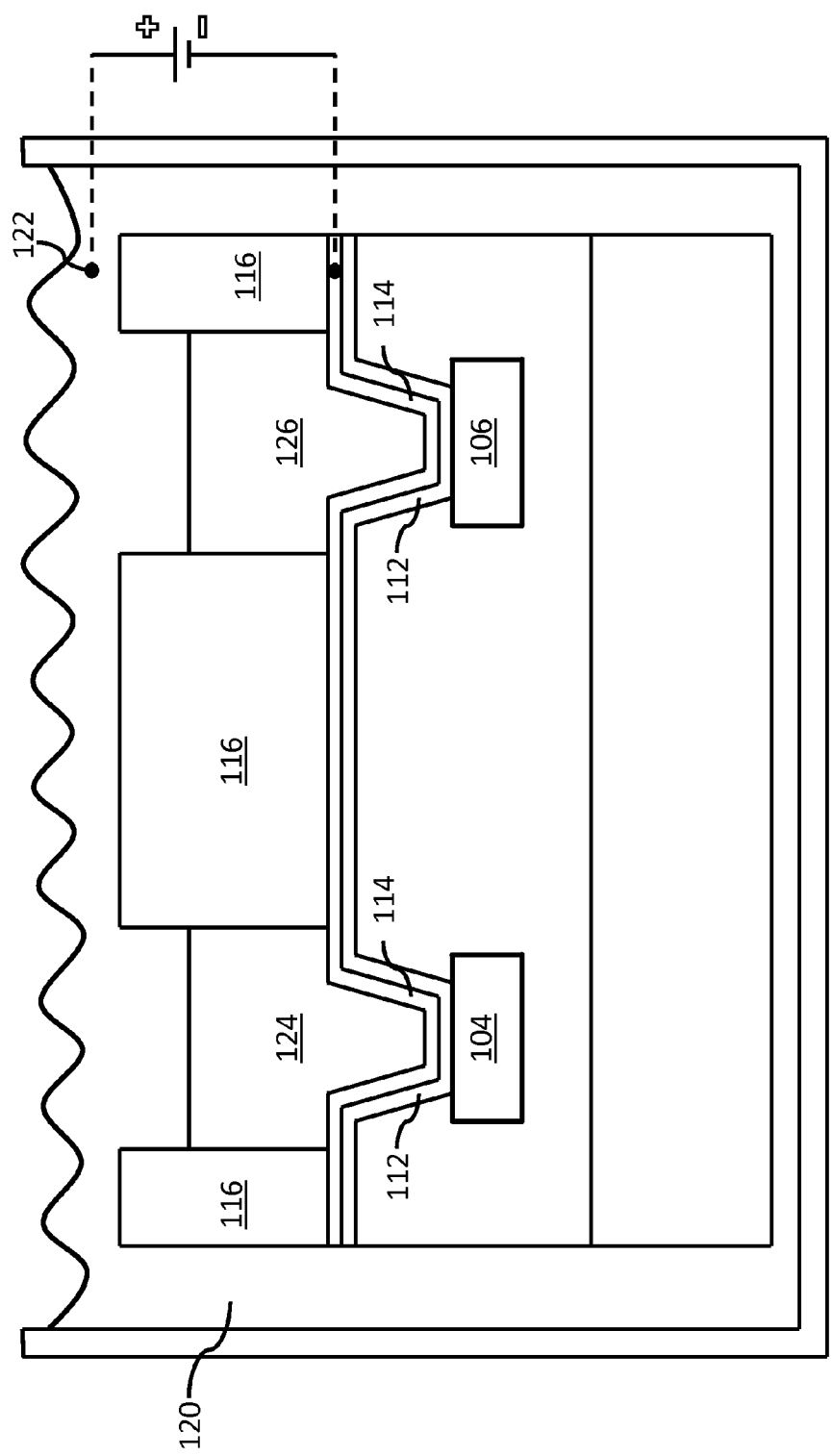
FIG. 4 depicts electroplating the device with a gold electrolyte solution such that first and second gold metallization structures form in the first and second openings on the seed layer, according to an embodiment.

Referring to FIG. 4, an electroplating process is performed. As used herein, electroplating refers to an electrodeposition technique in which the device is submerged in an electrolyte solution and a DC circuit is formed with the device. The DC circuit includes an anode and a cathode placed in an electrolyte solution. Under a DC bias, dissolved metal cations in the electrolyte solution deposit on the cathode. As a result, an essentially pure metal structure develops on the seed cathode.

In the electroplating process of the presently disclosed embodiment, a gold electrolyte solution 120, such as a cyanidic or sulfidic solution, is used. An anode 122 is placed in the gold electrolyte solution 120 and the seed layer 114 is used as a cathode of the DC circuit. As a result, essentially pure gold is electrodeposited on the seed layer 114. The anode 122 may be formed from any conductive material that is resistant to corrosion (e.g., platinum). The thickness of the gold that is deposited on the seed layer 114 depends upon parameters of the electroplating process such as duration, concentration of cations in the electrolyte solution, current flow and geometric parameters, such as open area and arrangement of the semiconductor devices.

Figure 5:
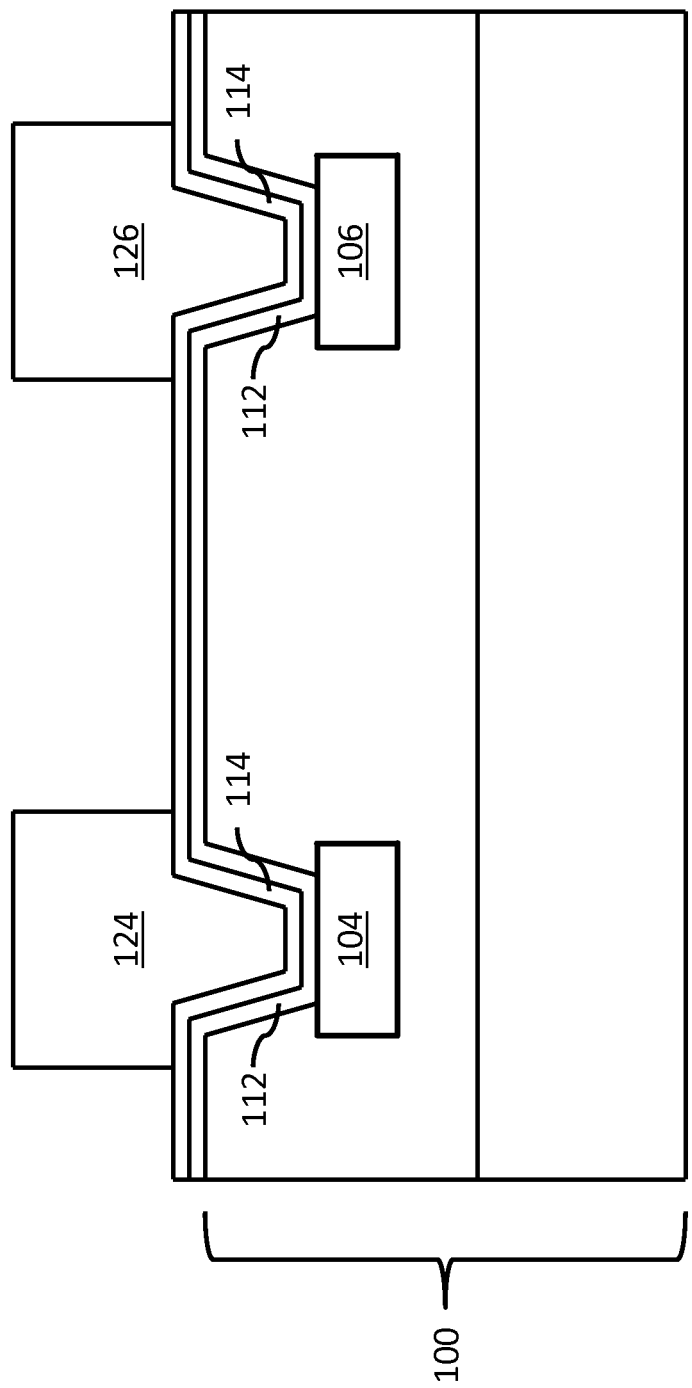
FIG. 5 depicts removing the mask, according to an embodiment.

In the embodiment of FIG. 4, the unmasked portions of the seed layer 114 are electroplated to form first and second gold metallization structures 124, 126 arranged in the first and second mask openings 118, 120, respectively. Thus, the geometry of the photoresist mask 116 defines the geometry of gold metallization structures 124, 126. As shown in FIG. 5, the mask 116 is subsequently removed from the substrate 100.

Figure 6:
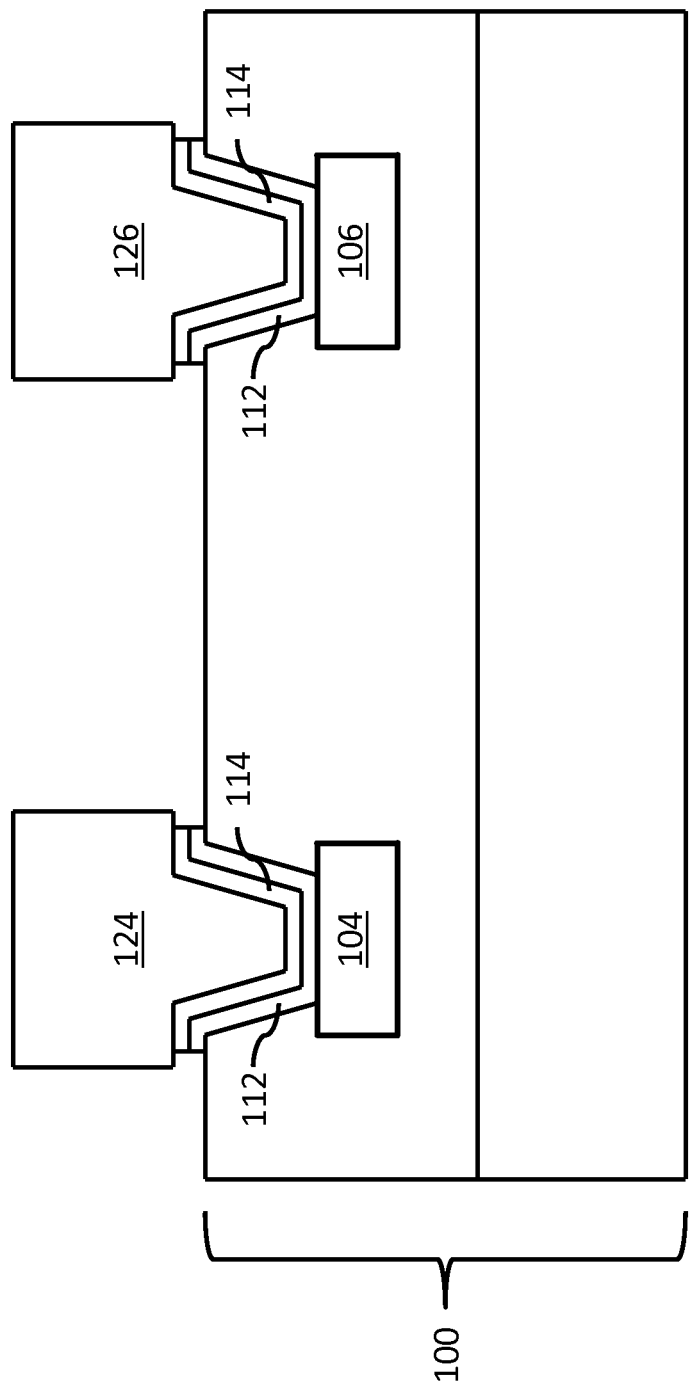
FIG. 6 depicts removing portions of the seed layer and the barrier layer so as to electrically isolate the first and second gold metallization structures, according to an embodiment.

Referring to FIG. 6, the (previously) masked portions of the seed layer 114 and the barrier layer 112 are removed. According to an embodiment, etching techniques are utilized to remove material from the seed layer 114 and the barrier layer 112 and consequently remove the (previously) masked portions of the seed layer 114 and the barrier layer 112. For example, both the seed layer 114 and the barrier layer 112 may be etched by a wet chemical etching process. Alternatively, the barrier layer 112 may be etched by a plasma etching process. The etching of the seed layer 114 and the barrier layer 112 is selective to gold so that the first and second gold metallization structures 124, 126 remain substantially intact after etching. In the embodiment of FIG. 6, lateral sections of the seed layer 114 and the barrier layer 112 between the first and second gold metallization structures 124, 126 are completely etched away so that the first and second gold metallization structures 124, 126 are electrically isolated from one another. In other words, there is no conductive path between the first and second gold metallization structures 124, 126 through the seed layer 114 or barrier layer 112.

According to an embodiment, the etching process is performed such that portions of the of the seed layer 114 underneath the first and second gold metallization structures 124, 126 are also etched away. In other words, etching of the seed layer 114 and the barrier layer 112 includes etching both the unmasked portions and part of the masked portions. This under-etch at the foundation of the first and second gold metallization structures 124, 126 may be a consequence of etching the seed layer 114 for a sufficient duration to ensure that all of the seed layer 114 material between the first and second gold metallization structures 124, 126 is removed, and that the first and second gold metallization structures 124, 126 are electrically isolated from one another.

Figure 7:
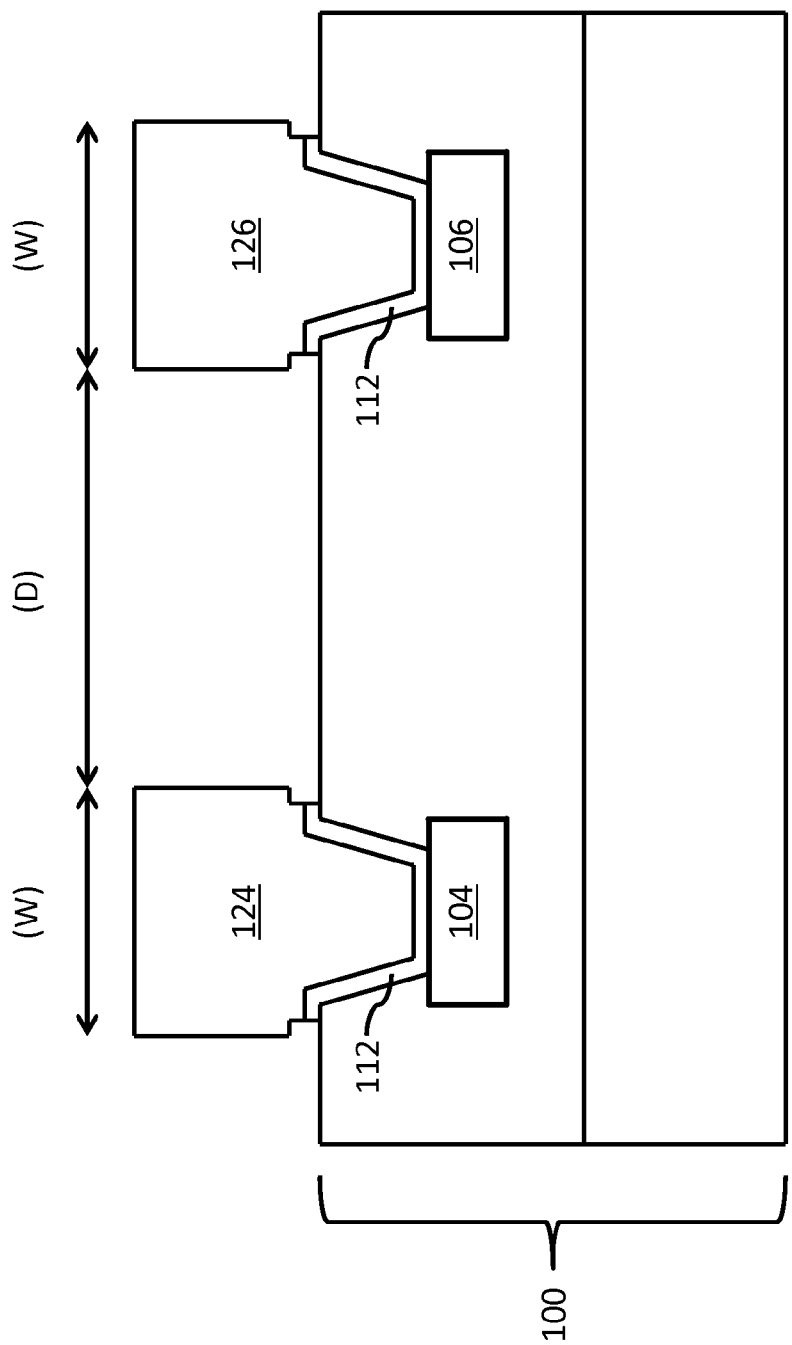
FIG. 7 depicts diffusing the remaining portions of the seed layer into the first and second gold metallization structures to form interfaces between the barrier layer and the first and second gold metallization structures that are substantially devoid of the seed layer in its metallic state, according to an embodiment.

Referring to FIG. 7, the remaining unmasked portions of the seed layer 114 are diffused into the first and second gold metallization structures 124, 126. As a result, the metallic state portions of the seed layer 114 are effectively eradicated. For example, in the event that the seed layer 114 is formed from copper, copper atoms disperse into the gold metallization structures 124, 126. Further, metallic state copper between the gold metallization structures 124, 126 and the barrier layer 112 is diminished.

According to an embodiment, diffusing the noble metal from the unmasked portion of the seed layer 114 includes diffusing all of the noble metal between the barrier layer 112 and the gold metallization structures 124, 126 into the gold metallization structures 124, 126 to form an interface between the barrier layer 112 and the metallization structures 124, 126 that is substantially devoid of the noble metal in its metallic state. In other words, the diffusion process is controlled so that the gold of the first and second gold metallization structures 124, 126 directly contacts the barrier layer 112. In the embodiments in which the seed layer 114 is formed from copper, this may be achieved by annealing the substrate 100 with the gold metallization structures 124, 126 and the metallic state copper of the seed layer 114 at a temperature between 200° and 400° C. for a duration of 10 to 60 minutes so that the copper completely diffuses in to the gold metallization structures 124, 126.

In the above described methods, the first and second gold metallization structures 124, 126 are electrically connected to the first and second terminals 104, 106, respectively, via the barrier layer 112. That is, a first region of the barrier layer 112 arranged between the first gold metallization structure 124 and the first terminal 104 provides an electrically conductive path. Likewise, a second region of the barrier layer 112 arranged between the second gold metallization structure 126 and the second terminal 106 provides an electrically conductive path. This electrical connection between the terminals 104, 106 and the gold metallization structures 124, 126 is not necessarily exclusively to the barrier layer 112, and may be completed through other regions and/or conductive materials In the above depicted sequence, diffusing the noble metal of the seed layer 114 is performed after removing the masked portions of the seed layer 114 and the barrier layer 112. As previously explained, all of the material of the seed layer 114 may be removed except for the portions of the seed layer 114 arranged underneath the gold metallization structures 124, 126. Subsequently, all of the remaining seed layer 114 material (e.g., copper) may be diffused into the gold metallization structures 124, 126 by the diffusion process. In other words, the device may be substantially free of the seed layer 114 material in its metallic state after the diffusion process.

By diffusing the all of the metallic state copper (in the embodiments that utilize copper as the seed layer 114 material) into the gold metallization structures 124, 126, the resulting semiconductor device includes a high-performance metallization that is not susceptible to electrical short due to the effects of electromigration, diffusion, and/or oxidation. The diffusion technique produces gold metallization structures 124, 126 with a percentage of copper. Depending upon the temperature and time conditions of the diffusion process, the copper may be concentrated towards the bottom of the structures 124, 126. However, this copper is in the form of diffused copper atoms (i.e., dispersed atoms) and not in the metallic state. Further, the interfaces between the first and second terminals 104, 106 and the first and second gold metallization structures 124, 126, respectively, can be formed to be substantially devoid of metallic copper. In other words, the methods and devices described herein avoid the drawbacks associated with copper, by enveloping the copper from the seed layer 114 into the gold metallization structures 124, 126.

By utilizing a patterned electrodeposition technique, advantageous structure widths are possible in the presently disclosed methods. According to an embodiment, a width (W) of the first and second gold metallization structures 124, 126 is less than 10 µm and a separation distance (D) between the first and second gold metallization structures 124, 126 is less than 10 µm. A variety of different dimensions are possible, and the minimum spacing between the metallization structures is determined by the capabilities of the photolithography process.

The device of FIG. 7 may be subsequently processed according to commonly known techniques. For example, a dielectric layer (not shown) that electrically insulates the first and second gold metallization structures 124, 126 from one another may be formed on the substrate 100. Higher level metallization layers may be formed on the substrate 100 as well.

Figure 8:
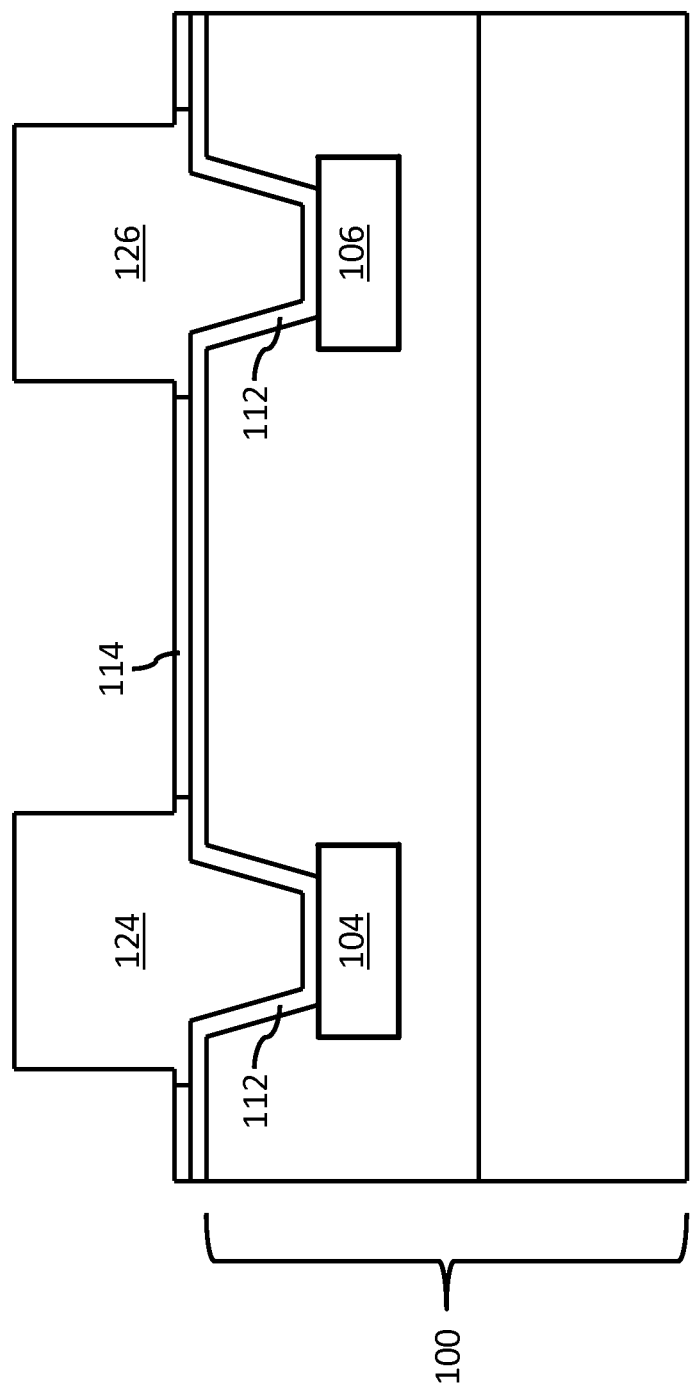
FIG. 8 depicts an alternate process sequence in which the diffusion step is performed prior to removing portions of the seed layer and the barrier layer such that gold from the first and second gold metallization structures laterally diffuses into the seed layer, according to an embodiment.
Figure 9:
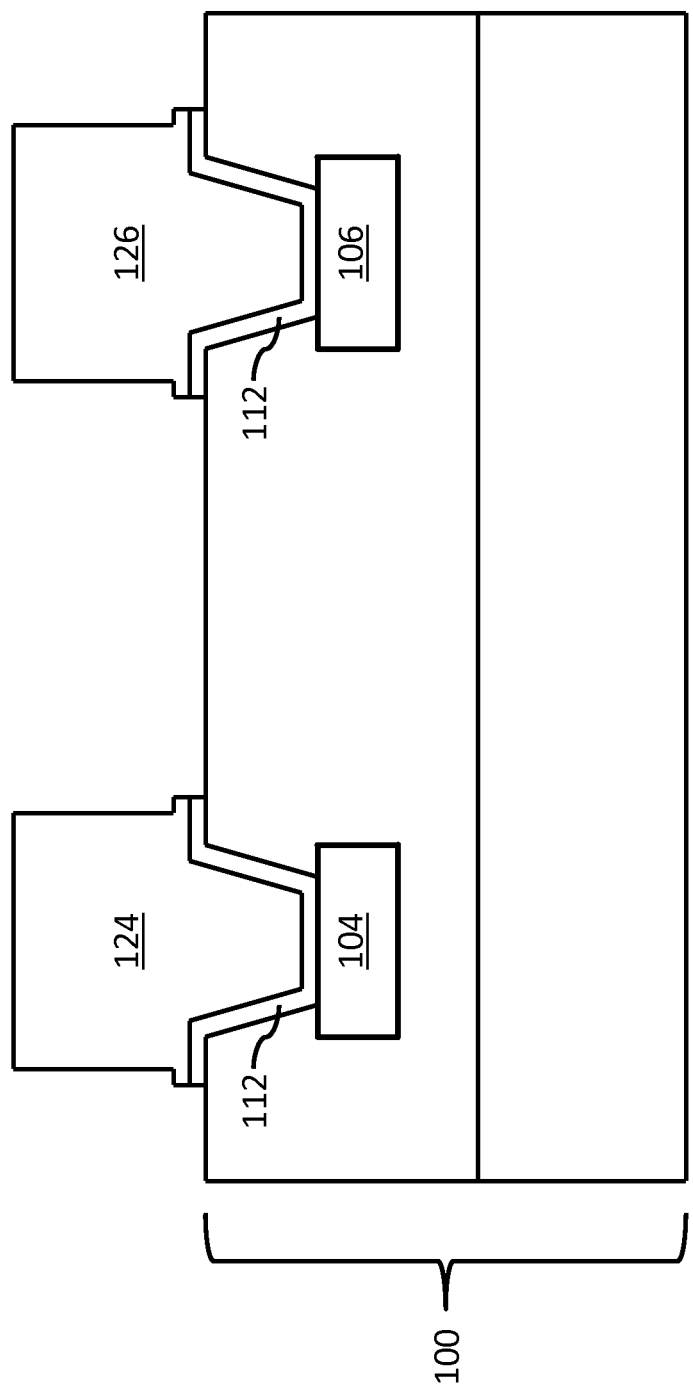
FIG. 9 depicts removing the portions of the seed layer and the barrier layer from the device in FIG. 8 selective to gold, according to an embodiment.

FIGS. 8-9 depict an alternate embodiment in which the diffusing the noble metal of the seed layer 114 is performed prior to removing the masked portions of the seed layer 114 and the barrier layer 112. In this embodiment, the device may be formed according to the process steps disclosed with reference to FIGS. 1-5. Subsequently, a diffusion process such as the process described with reference to FIG. 7 is performed. If the seed layer 114 is formed from copper, the substrate 100 including the seed layer 114 and the first and second gold metallization structures 124, 126 may be annealed at temperature between 200° and 400° C. so that all of the metallic state copper underneath the first and second gold metallization structures 124, 126 diffuses away from the interface. Concurrently, gold material from the first and second gold metallization structures 124, 126 laterally diffuses into the masked portions of the seed layer 114. FIG. 8 depicts an exemplary boundary of the laterally diffused gold. According to an embodiment, the gold diffuses into the seed layer 114 to a certain lateral distance, depending on temperature and diffusion duration. For example, the gold may be laterally diffused into the seed layer by a distance of 0.3-0.5 µm.

As shown in FIG. 9, the masked portions of the seed layer 114 and the barrier layer 112 are subsequently removed. The seed layer 114 may be removed by a wet chemical etch and the barrier layer 112 may be removed by a wet chemical etch or a plasma etch, for example. One advantage of the process sequence of FIGS. 8-9 is increased mechanical stability of the metallization structures 124, 126. This increased mechanical stability arises due to the laterally diffused gold, which expands the foundation of the metallization structures 124, 126.

The term "substantially" encompasses absolute conformity with a requirement as well as minor deviation from absolute conformity with the requirement due to manufacturing process variations, assembly, and other factors that may cause a deviation from the ideal. Provided that the deviation is within process tolerances so as to achieve practical conformity, the term "substantially" encompasses any of these deviations. For example, a "substantially" pure metal may include a very low percentage of alloy metal atoms, but nonetheless provides the desired qualities (e.g., electrical resistance, resistance to corrosion, etc.) of a pure metal in a semiconductor device. Likewise, an interface that is substantially devoid of the noble metal in its metallic state may have a small percentage of noble metal in the metallic state, so long as this amount is within acceptable process tolerances and the risk of electrical short attributable to the metallic state noble metal is negligible or non-existent.

Within this specification the terms "in electrical contact," "electrically connected," "in low resistive electric contact," "electrically coupled," "in low ohmic contact," and "in low resistive electric connection" are used synonymously. Likewise, the terms "in resistive electric contact," "in ohmic contact," and "in resistive electric connection" are used synonymously within this specification.

Spatially relative terms such as "under," "below," "lower," "over," "upper," "above," "beneath" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a metallization for electrically connecting one or more semiconductor devices, the method comprising;
    forming an electrically conductive barrier layer on a semiconductor substrate such that the barrier layer covers a first terminal of a device formed in the substrate;
    forming a seed layer on the barrier layer, the seed layer extending over the first terminal and comprising a noble metal other than gold;
    masking the substrate with a mask having a first opening that is laterally aligned with the first terminal such that an unmasked portion of the seed layer is exposed by the first opening and such that a masked portion of the seed layer is covered by the mask,
    electroplating the unmasked portion of the seed layer using a gold electrolyte solution so as to form a first gold metallization structure arranged in the first mask opening;
    removing the mask;
    removing the masked portions of the seed layer and the barrier layer; and
    diffusing the noble metal from the unmasked portion of the seed layer into the first gold metallization structure,
    wherein the first gold metallization structure is electrically connected to the first terminal via the barrier layer, and
    wherein diffusing the noble metal comprises diffusing all metallic state noble metal from the unmasked portion of the seed layer into the first gold metallization structure such that gold from the first gold metallization structure directly contacts the barrier layer.

2. The method of claim 1, wherein the noble metal is copper.

3. The method of claim 2, wherein diffusing the noble metal comprises annealing the substrate comprising the first gold metallization structure and the metallic state copper at a temperature between 200° and 400° C. for a duration of 10 to 60 minutes.

4. The method of claim 1, wherein the noble metal comprises any one of: silver, platinum or palladium.

5. The method of claim 1, wherein the substrate comprises a second terminal of a device that is laterally separated from the first terminal, wherein the barrier layer is formed such that a continuous barrier layer portion contacts the first and second terminals and extends along a surface of the substrate between the first and second terminals, wherein the seed layer is formed such that a continuous seed layer portion covers the continuous barrier layer portion, wherein masking the substrate comprises providing a second mask opening that is laterally aligned with the second terminal, and wherein electroplating comprises forming a second gold metallization structure arranged in the second mask opening and electrically connected to the second terminal.

6. The method of claim 5, wherein removing the masked portions of the seed layer and the barrier layer comprises etching the masked portions of the seed layer and the barrier layer selective to gold such that the first and second gold metallization structures are electrically isolated from one another.

7. The method of claim 6, further comprising etching portions of the seed layer and the barrier layer directly underneath the first and second gold metallization structures during etching the masked portions of the seed layer and the barrier layer.

8. The method of claim 6, wherein the barrier layer comprises Ta, TaN, Ti/TiN, Ti or TiW, wherein the noble metal is copper, wherein etching the seed layer comprises a wet chemical etch of copper selective to gold, and wherein etching the barrier layer comprises a wet chemical etch or a plasma etch.

9. The method of claim 1, wherein diffusing the noble metal is performed after removing the masked portions of the seed layer and the barrier layer.

10. The method of claim 1, wherein diffusing the noble metal is performed prior to removing the masked portions of the seed layer and the barrier layer.

11. The method of claim 9, wherein diffusing the noble metal of the unmasked portion comprises laterally diffusing gold from the first gold metallization structure into the masked portions of the seed layer.

12. A method of forming a gold metallization structure by electrodeposition using a copper seed layer, the method comprising:
    forming an electrically conductive barrier layer covering a surface of a semiconductor substrate, the substrate comprising a source and drain terminal of a semiconductor device, such that a continuous portion of the barrier layer contacts the source and drain terminals;
    forming a copper seed layer such that a continuous seed layer portion covers the continuous portion of the barrier layer;
    masking the seed layer with a mask having first and second openings that are laterally aligned with the source and drain terminals;
    electroplating unmasked portions of the seed layer using a gold electrolyte solution so as to form first and second gold metallization structures arranged in the first and second openings;
    removing the mask;
    removing the masked portions of the seed layer and the barrier layer so as to electrically isolate the first and second gold metallization structures; and
    diffusing copper atoms from the seed layer into the first and second gold metallization structures,
    wherein the first and second gold metallization structures are electrically connected to the source and drain terminals, respectively, and
    wherein diffusing the copper atoms comprises diffusing all metallic state copper from the unmasked portions of the seed layer into the first gold metallization structure such that gold from the first gold metallization structure directly contacts the barrier layer.

13. The method of claim 12, further comprising laterally diffusing gold from the first and second gold metallization structures into the masked portions of the seed layer prior to removing the masked portions of the seed layer.

14. The method of claim 12, further comprising etching portions of the seed layer and the barrier layer directly underneath the first and second gold metallization structures during removing the masked portions of the copper seed layer and the barrier layer.

\* \* \* \* \*